(12) United States Patent
Chang et al.

(10) Patent No.: US 10,325,982 B1
(45) Date of Patent: Jun. 18, 2019

(54) DRAIN LEDGE FOR SELF-ALIGNED GATE AND INDEPENDENT CHANNEL REGION AND DRAIN-SIDE RIDGES FOR SLCFET

(71) Applicant: Northrop Grumman Systems Corporation, Falls Church, VA (US)

(72) Inventors: Josephine Chang, Ellicott City, MD (US); Ken Alfred Nagamatsu, Ellicott City, MD (US); Robert Samuel Howell, Silver Spring, MD (US); Shalini Gupta, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/982,104

(22) Filed: May 17, 2018

(51) Int. Cl.
| | |
|---|---|
| *H01L 29/66* | (2006.01) |
| *H01L 29/06* | (2006.01) |
| *H01L 29/78* | (2006.01) |
| *H01L 29/423* | (2006.01) |
| *H01L 29/778* | (2006.01) |

(52) U.S. Cl.
CPC ...... *H01L 29/0634* (2013.01); *H01L 29/0696* (2013.01); *H01L 29/4236* (2013.01); *H01L 29/66462* (2013.01); *H01L 29/66666* (2013.01); *H01L 29/778* (2013.01); *H01L 29/7827* (2013.01)

(58) Field of Classification Search
CPC ............. H01L 29/03; H01L 29/66666; H01L 29/66462; H01L 29/4236; H01L 29/6643; H01L 29/778–29/7789; H01L 2924/13064; H01L 29/122–29/127; H01L 29/15; H01L 21/02507
See application file for complete search history.

(56) References Cited

U.S. PATENT DOCUMENTS

| | | | |
|---|---|---|---|
| 5,053,348 A | 10/1991 | Mishra et al. | |
| 5,793,082 A | 8/1998 | Bryant | |
| 6,337,262 B1 | 1/2002 | Pradeep et al. | |
| 7,598,146 B2 | 10/2009 | Hodges | |
| 8,344,358 B2 | 1/2013 | Avouris et al. | |
| 9,385,224 B2 * | 7/2016 | Renaldo | H01L 29/7783 |
| 9,466,679 B2 * | 10/2016 | Stewart | H01L 29/2003 |
| 9,673,311 B1 | 6/2017 | Moens et al. | |
| 9,773,897 B2 | 9/2017 | Nechay et al. | |
| 2009/0032804 A1 | 2/2009 | Kalburge | |

(Continued)

*Primary Examiner* — William F Kraig
*Assistant Examiner* — Khatib A Rahman
(74) *Attorney, Agent, or Firm* — Edell, Shapiro & Finnan, LLC (57) ABSTRACT

A transistor device comprises a base structure and a superlattice of conducting channels overlying the base structure. The superlattice of conducting channels includes source and drain access regions spaced-apart from each other, a ledge between and spaced-apart from the source and drain access regions, and source-side alternating multichannel ridges and trenches that extend from the source access region to the ledge, each ridge having a topside and opposing sidewalls that each extend from the ledge to the source access region. The transistor device includes gate metal that covers each ridge continuously from the ledge to the source access region, such that the gate metal completely covers the topside of the ridge and edges of the conducting channels that intersect the sidewalls of the ridge.

20 Claims, 8 Drawing Sheets

(56) References Cited

U.S. PATENT DOCUMENTS

| | | | |
|---|---|---|---|
| 2009/0101939 A1* | 4/2009 | Smith | H01L 27/0605 257/194 |
| 2010/0059737 A1 | 3/2010 | Bhuwalka et al. | |
| 2014/0264273 A1* | 9/2014 | Howell | H01L 29/7784 257/20 |
| 2015/0123215 A1* | 5/2015 | Obradovic | H01L 29/42392 257/410 |
| 2016/0126340 A1* | 5/2016 | Nechay | H01L 29/7783 257/20 |
| 2016/0293713 A1* | 10/2016 | Nechay | H01L 29/7851 |
| 2017/0373183 A1* | 12/2017 | Yamashita | H01L 21/02164 |

* cited by examiner

DRAIN LEDGE FOR SELF-ALIGNED GATE AND INDEPENDENT CHANNEL REGION AND DRAIN-SIDE RIDGES FOR SLCFET

TECHNICAL FIELD

The present disclosure relates generally to transistor devices and more specifically to field effect transistor (FET) devices.

BACKGROUND

A conventional superlattice castellated field effect transistor (SLCFET) device includes superlattice castellations or ridges having lengths sized to be much larger than a length of a gate of the device. Deposition of gate metal divides the castellations into a channel region directly under the gate, flanked on either side by source and drain access regions whose lengths vary depending on an alignment of the gate to the castellations. These variations are undesired and have an adverse impact on device performance.

SUMMARY OF THE INVENTION

A transistor device comprises a base structure and a superlattice of conducting channels overlying the base structure. The superlattice of conducting channels includes source and drain access regions spaced-apart from each other, a ledge between and spaced-apart from the source and drain access regions, and source-side alternating multichannel ridges and trenches that extend from the source access region to the ledge, each ridge having a topside and opposing sidewalls that each extend from the ledge to the source access region. The transistor device includes gate metal that covers each ridge continuously from the ledge to the source access region, such that the gate metal completely covers the topside of the ridge and edges of the conducting channels that intersect the sidewalls of the ridge.

DESCRIPTION OF EXAMPLE EMBODIMENTS

Certain heterostructure materials, such as Aluminum Gallium Nitride (AlGaN) and GaN, create an electron well (i.e., a sheet of electrons) at an interface between the two dissimilar materials resulting from the piezoelectric effect and a spontaneous polarization effect therebetween. The resulting sheet of electrons that forms at this interface is typically referred to as a Two-Dimensional Electron Gas ("2DEG") channel (also referred to simply as a "2DEG"). Equally applicable is a superlattice structure having a plurality of two-dimensional hole gas (2DHG) channels. Both types of structures can be referred to as "2DxG channel(s)" devices. FETs that operate by generating and controlling the electrons in the 2DxG channel are conventionally referred to as high electron mobility transistors ("HEMTs").

By stacking a plurality of these two-material heterostructures, and with the addition of appropriate doping in the layers to maintain the presence of the 2DxG channels when stacking a plurality of heterostructure layers, the electron sheets are able to act in parallel, allowing for greater current flow through the superlattice device. When a FET that employs the stacked 2DXG channels is "on," the superlattice device has a lower on-resistance, relative to a single heterostructure-layer device, because the multiple 2DEG channels allow a proportionally higher current to flow between a source and a drain of the FET, resulting in an overall reduction in on-resistance.

Figure 4:
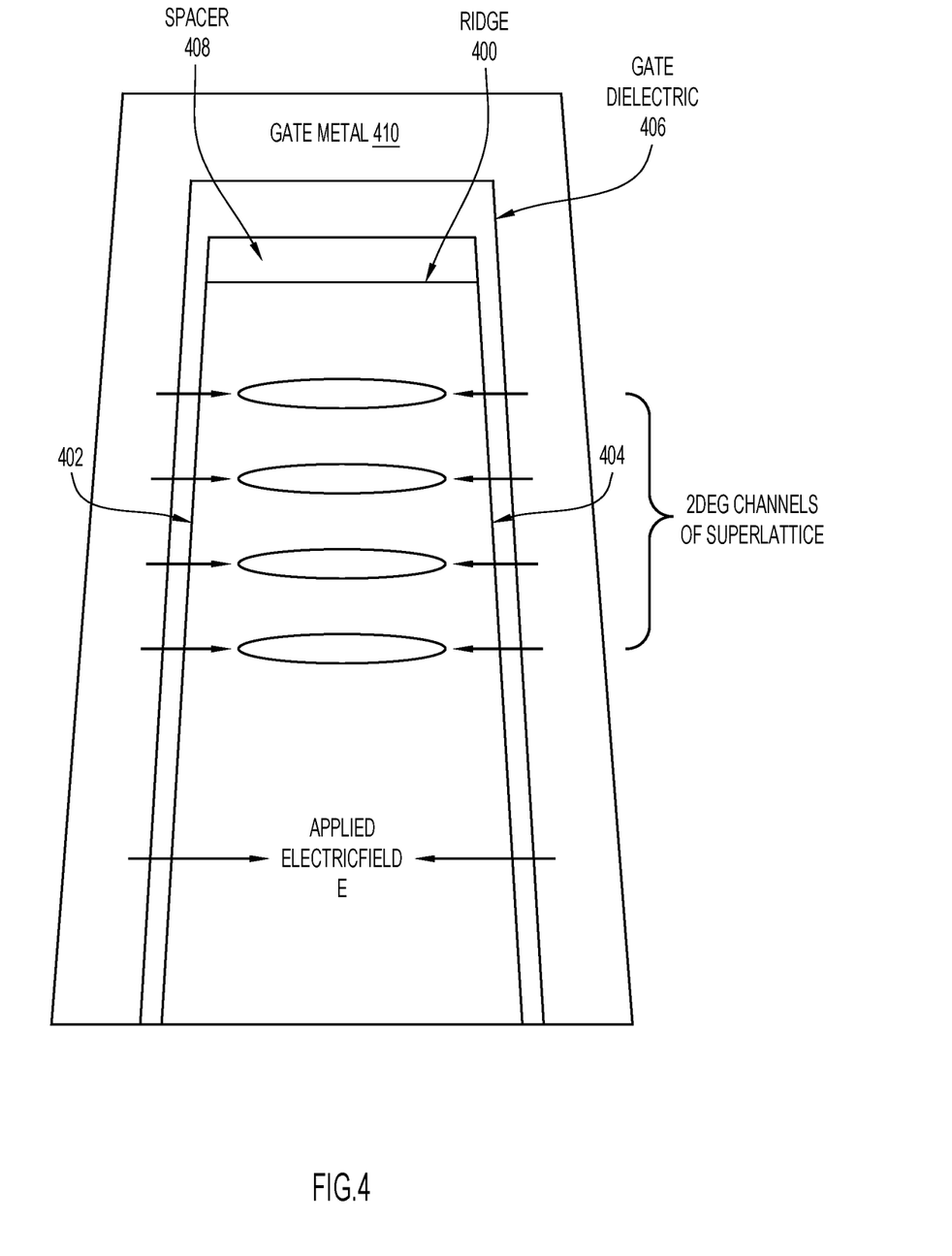
FIG. 4 is a cross-sectional view of an example, generalized superlattice multichannel ridge of an SLCFET including Two-Dimensional Electron Gas ("2DEG") channels (also referred to more simply as "2DEGs") and gate metal.

A superlattice castellated field effect transistor (SLCFET) device is a FET built on a superlattice of stacked 2DEGs. In order to deplete-out and pinch-off the superlattice channels (the 2DEGs), a series of fin-like structures or ridges is etched into the superlattice between a source and a drain, forming "castellations," so named for their resemblance to the undulating top of a castle wall. FIG. 4 is a cross-sectional view of a generalized ridge 400 etched into a superlattice structure. Ridge 400 forms vertically stacked 2DEGs between opposing sidewalls 402 and 404 of the ridge. Conformal gate metal 410 covers ridge 400. In addition, a gate dielectric 406 and a spacer layer 408, lying beneath gate metal 410, may optionally cover ridge 400. A voltage applied to gate metal 410 applies a gate electric field E from sidewalls 402 and 404 of ridge 400, to deplete all of the 2DEGs simultaneously from edges of the 2DEGs near the sidewalls. When the (FET) device is on, the 2DEGs conduct current into and out of the page. The voltage turns the (FET) device off by fully depleting the 2DEGs from sidewalls 402 and 404.

A conventional SLCFET device includes superlattice castellations/ridges having lengths sized to be much larger than a length of a gate of the device. Deposition of gate metal thus divides the castellations into a channel region directly under the gate, flanked on either side by castellated source and drain access regions whose lengths vary depending on an alignment of the gate to the castellations. These variations are undesired and have an adverse impact on device performance.

Accordingly, embodiments presented herein are directed to an SLCFET device structure that includes a self-aligned gate structure. The self-aligned gate structure completely eliminates superlattice castellations in a source access region, minimizing variability in source resistance, and thus maximizing linearity and resulting dynamic range of the SLCFET device structure. The self-aligned gate structure includes a castellated channel region including alternating trenches and castellations (i.e., ridges) underlying gate metal. A length of the trenches sets a gate length, spacing between the trenches sets a width of each castellation, and a width of the trenches determines a duty cycle of the castellations. According to the embodiments, the channel region is bordered by a continuous drain ledge (also referred to more simply as a "ledge") on a drain side of the SLCFET device structure. The ledge is wide enough (in the source to drain direction) to accommodate misalignment tolerance between the castellation and gate e-beam lithography. In an embodiment, at gate patterning, the gate is patterned wide enough to completely fill the channel region trenches. The gate is sized slightly larger than the gate length to accommodate misalignment, with excess metal falling over and onto the ledge or the (uncastellated) source access region bordering the channel region. These and additional features of the self-aligned gate structure are described in detail below.

Figure 1:
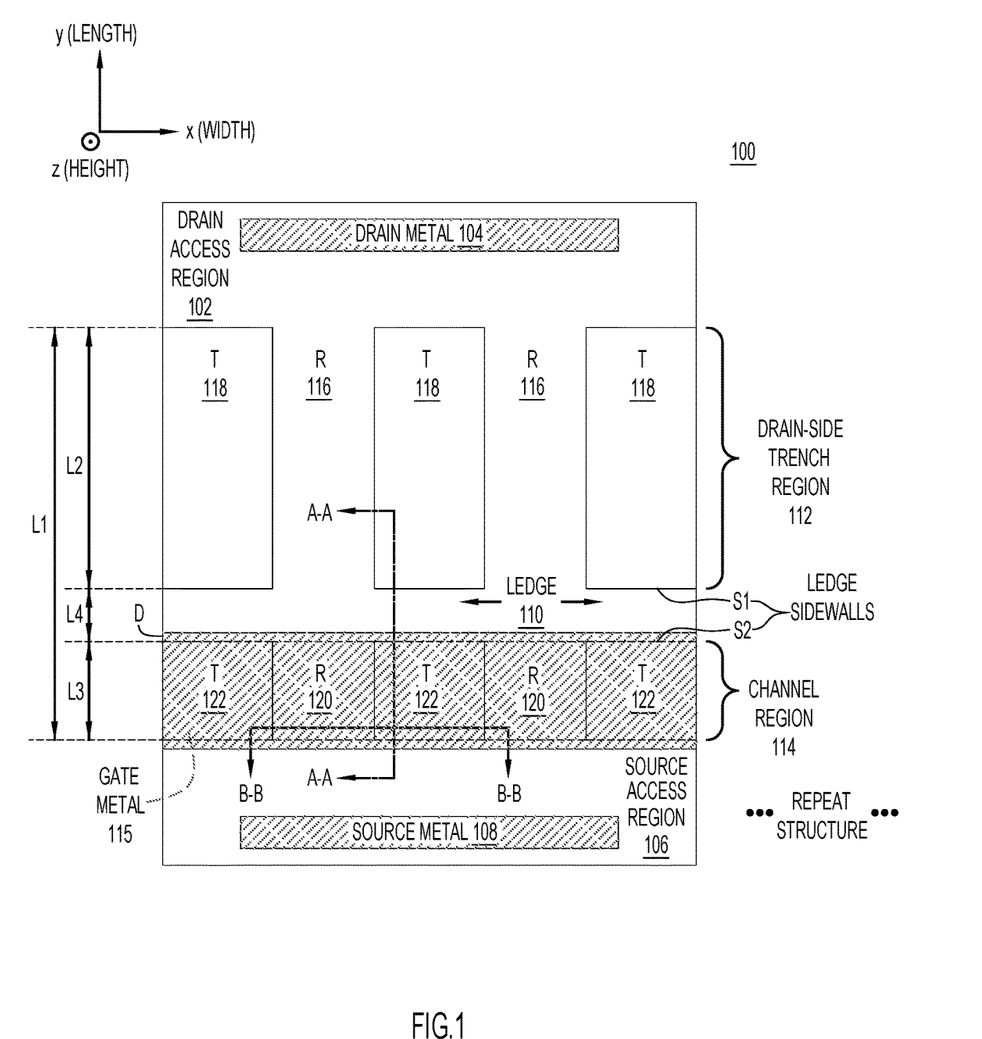
FIG. 1 is a top plan view of an example superlattice castellated field effect transistor (SLCFET) device structure.
Figure 2A:
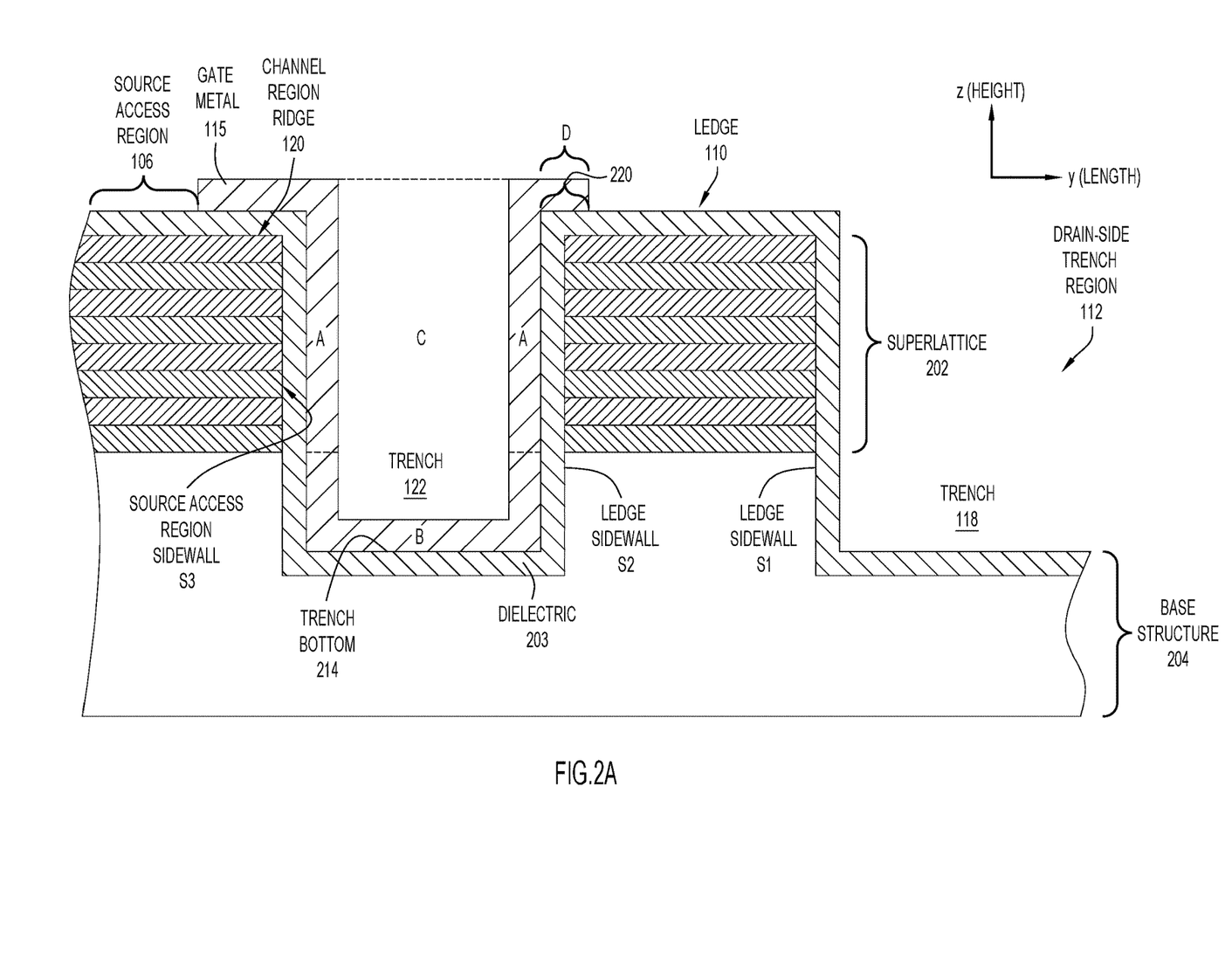
FIG. 2A is a cross-sectional view of the example SLCFET device structure taken along the line A-A in FIG. 1.
Figure 2B:
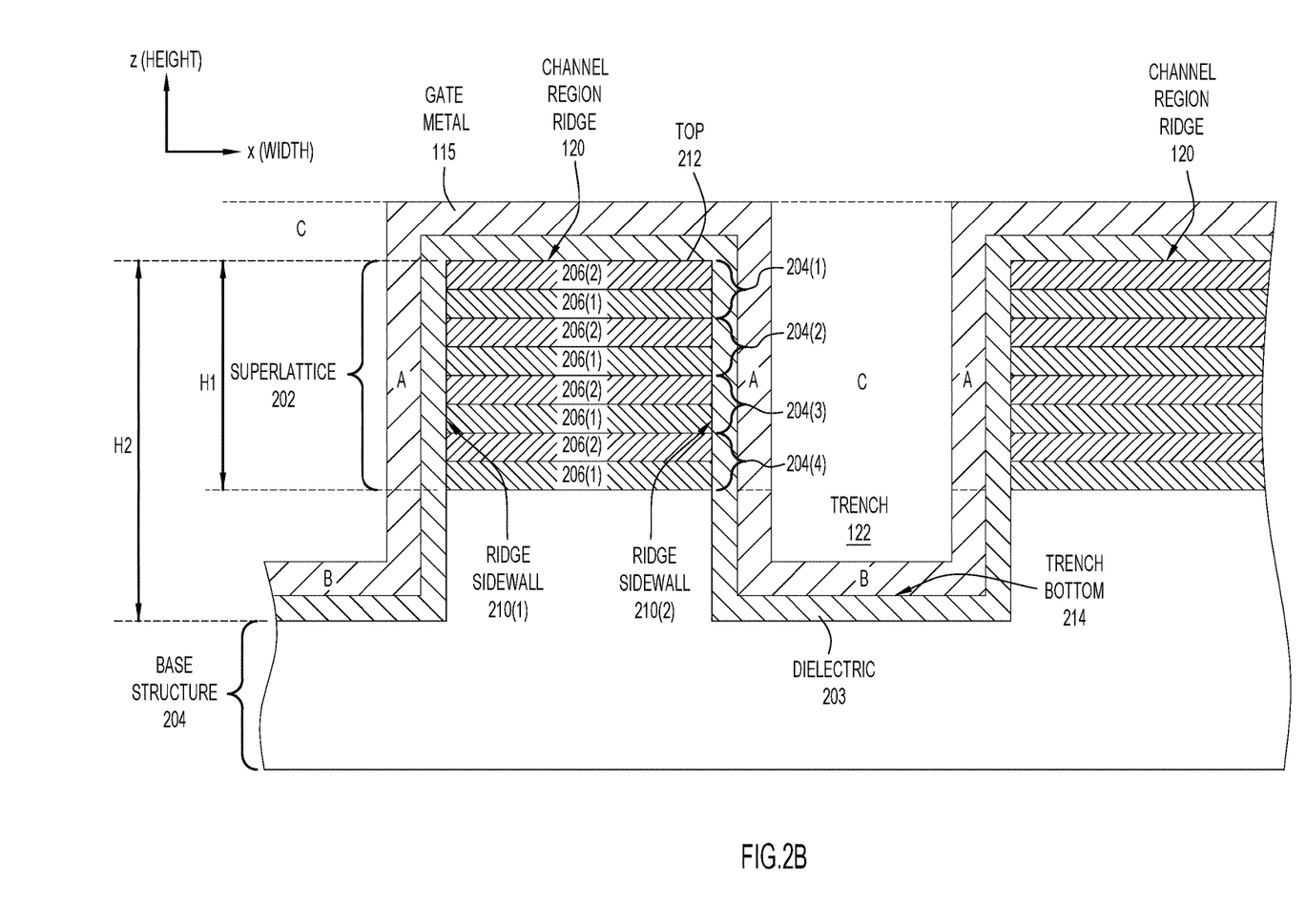
FIG. 2B is a cross-sectional view of the example SLCFET device structure taken along the line B-B of FIG. 1.

FIG. 1 is a top plan view of an example SLCFET device structure 100. FIGS. 2A and 2B are cross-sectional views of SLCFET device structure 100 taken along lines A-A and B-B, respectively. SLCFET device structure 100 represents a slice of an SLCFET device that repeats in a width direction. With reference primarily to FIG. 1, device structure 100 includes: an uncastellated drain-access region 102 having a substantially planar top surface (i.e., the drain access region does not include alternating multichannel ridges and trenches); drain metal 104 overlying a portion of the drain access region; a substantially planar, uncastellated source access region 106 spaced-apart from the drain access region 102 in a length direction by a length L1; source metal 108 overlying a portion of the source access region; a ledge 110 between and spaced-apart from the drain access region and the source access region in the length direction by lengths L2 and L3, respectively, the ledge having a relatively small length L4 extending between opposing sidewalls S1 and S2 of the ledge, and a relatively wide width that extends continuously across a full width (transverse from the length) of the device structure; an optional drain-side trench region 112 extending the length L2 from sidewall S1 of the ledge to the drain access region; a castellated channel region 114 (also referred to as a "source-side trench region") extending the length L3 from sidewall S2 of the ledge to the source access region; and gate metal 115 (shown in shaded view) overlying the channel region continuously over the full length L3 (the channel region is directly under the gate metal). Example dimensions of lengths L1, L2, and L3 include for L1: 200-1100 nanometers (nm), for L2: 100-750 nm, and for L3: 50-250 nm (assuming that length L4 has a dimension on the order of 50-100 nm).

Drain-side trench region 112 includes alternating superlattice ridges (R) 116 and trenches (T) 118 (also referred to as drain-side ridges/trenches, or simply drain ridges/trenches) that undulate across the width of device structure 100 and that have respective (elongate) lengths L2. Channel region 114 includes alternating superlattice ridges 120 and trenches 122 (also referred to as channel ridges/trenches), covered by gate metal 115, that also undulate across the width of device structure 100 and that have respective lengths L3. In another embodiment, drain-side trench region 112 may be omitted.

In the ensuing description, ridges 116/120 may be referred to singularly as ridge 116/120, and trenches 118/122 may be referred to singularly as trench 118/122. Also, the ridges may be referred to as "multichannel ridges" because they include multiple conducting channels, as shown in FIG. 4, whereas the trenches represent holes in the superlattice between the multichannel ridges and thus do not include the multiple channels.

As shown in the cross-sectional views of FIGS. 2A and 2B taken along the lines A-A and B-B of FIG. 1, respectively, device structure 100 includes a superlattice 202 of parallel conducting channels overlying (i.e., on top of or covering) a base structure 204 in a height direction (i.e. a z-direction). Device structure 100 may also include an optional dielectric layer or gate dielectric 203 lying between superlattice 202 and base structure 204. Referring primarily to FIG. 2B, in an embodiment, superlattice 200 includes multiple parallel heterostructures 204(1)-204(4) (collectively referred to as "heterostructures 204") overlying one another over a height H1 to form a vertical stack of horizontal (parallel) heterostructures overlying base structure 204, each heterostructure forming a corresponding one of the conducting channels of the superlattice. An optional spacer layer (not shown in FIGS. 2A and 2B), such as spacer layer 408 depicted in FIG. 4, may overlie top heterostructure 204(1). Each heterostructure 204(i) respectively includes a first layer 206(1) and a second layer 206(2) overlying the first layer so as to form a respective one of the conducting channels of the superlattice at an interface between the two layers. While a stack of 4 heterostructures are shown, it is understood that a stack of more or fewer heterostructures (and resulting superlattice channels) may be used.

In an example, first layer 206(1) of each heterostructure 204(i) comprises GaN, and second layer 206(2) of each heterostructure 204(i) comprises AlGaN; however, a variety of heterostructures may be employed as long as each heterostructure comprises two layers of dissimilar materials configured to create a sheet of electrons (i.e. a 2DEG channel) or a sheet of holes (i.e., a 2DHG channel) at the interface between the two dissimilar materials. Various additional heterostructure materials include, but are not limited to, Aluminum Gallium Arsenide (AlGaAs) and Gallium Arsenide (GaAs), Indium Aluminum Nitride (InAlN) and GaN, and alloys of Silicon (Si) and Germanium (Ge) overlying a base structure.

Still referring primarily to FIG. 2B, each superlattice ridge 120 in channel region 114 includes opposing sidewalls 210(1) and 210(2) (collectively referred to as "sidewalls 210") extending upward (i.e., rising) a height H2 from base structure 204 to a substantially horizontal topside 212. Together, sidewalls 210 and topside 212 contain a respective portion of superlattice 200, such that edges of the contained portion of the superlattice (e.g., the edges of heterostructures 204 in the contained portion) meet/intersect, and are thus are generally exposed at, the sidewalls and the top side. Sidewalls 210(1) and 210(2) of each ridge 120 each lead, or transition, into a trench bottom or nadir 214 of a respective one of trenches 122 adjacent the ridge formed by the sidewalls. Sidewalls 210 may be substantially vertical as shown in FIG. 2B, such that a separation between the sidewalls remains substantially constant as the sidewalls rise from base structure 204 to topside 212. Alternatively, sidewalls 210 may be tapered/inclined toward each other such that their separation decreases with their height, similar to the ridge configuration shown in FIG. 4.

Above-described features of device structure 100 have the following example dimensions. For drain ridges 116, the width may range from 50-200 nm, and may vary along length L2. For channel ridges 120, the widths may range from 30-200 nm. For trench 118 the width may range from 50-200 nm. The height H2 of ridge 116/120 and the depth of trench 118 are the same, and can be 50-250 nm. The ledge dimension between the channel and drain trenches can be 30-100 nm long (L4 dimension in the plan-view of FIG. 1).

Superlattice ridges 116 and trenches 118 of drain-side trench region 112 are configured similarly to superlattice ridges 120 and trenches 122 of channel region 114, respectively. Moreover, ledge 110 is configured similarly to each of ridges 120, except that ledge 110 represents a ridge that runs transverse to ridges 120. That is, ledge 110 has an elongate structure that extends continuously in the width direction, whereas ridges 120 each have an elongate structure that extends in the length direction.

Referring to FIGS. 1, 2A, and 2B, in channel region 114, gate metal 115 of a gate contact overlies ridges 120 and trenches 122 continuously along their full lengths L3 from ledge sidewall S2 that forms a boundary between ledge 110 and channel region 114, and that constrains gate metal 115 to the channel region, to a sidewall S3 of source access region 106 that marks a boundary between the source access region and the channel region. At a minimum, gate metal 115 overlies or covers top side 212 and sidewalls 210 of each ridge 120 so as to cover completely the portion of superlattice 202 contained by the ridge. That is, gate metal 115 completely and continuously covers top side 212 and each of sidewalls 210 at least over their heights H1 where superlattice 202 (and its resulting conducting channels) meets with/intersects the sidewalls.

Several configurations of gate metal 115 ensure the aforementioned minimum gate metal coverage. A first configuration of gate metal 115 includes a conformal layer of gate metal A (best shown in FIGS. 2A and 2B) overlying topside 212 and only heights H1 of sidewalls 210 of each ridge 120. Gate metal A also conformally covers sidewalls S3 of ledge 110; however, gate metal A does not completely cover (i.e., extend to the bottom portions 214) of trenches 122, which are thus left partially uncovered by the gate metal.

A second configuration of gate metal 115 includes conformal layer of gate metal A as described above and, additionally, a conformal layer of gate metal B overlying the bottom portions 214 of trenches 122. Gate metal B contacts or is contiguous with conformal layer A to form a continuous layer of gate metal A-B. In this configuration, gate metal 115 conformally covers ridges 120 and trenches 122 completely along their lengths L3.

In a third configuration, gate metal 115 includes gate metal A, gate metal B, and, additionally, gate metal C, which completely fills each trench 122 up to or above a full height of ridges 120 above base structure 204. In this configuration, the combination of gate metal A, B, and C forms a respective gate metal post that fills each trench 122.

In a fourth configuration, gate metal 115 includes the posts of the third configuration and also includes a bar adjoining adjacent posts across ridges 120 and trenches 122 to form a T-gate that stretches across the width of device structure 100, as will be described below in connection with FIG. 3. The fourth configuration is similar to the third configuration, but adds the bar structure.

In all of the first-fourth configurations, gate metal 115 is connected from ridge-to-ridge, i.e., across the tops of channel ridges 120, and such metal connections may take the form of the bar of the fourth configuration, or any other similar metal connecting structure.

The conducting layers of superlattice 204 (e.g., the edges of heterostructures 204) also meet/intersect sidewall S2 of ledge 110 along the width of the ledge. Thus, each of the first-fourth configurations of metal 115 described above also continuously overlies/covers sidewall S2 of ledge 110 along the width of the ledge so as to completely cover the conducting layers of superlattice 204 that intersect the ledge sidewall (see, particularly, gate metal A). Gate metal 115 may include a portion of gate metal D that spills over onto and thus overlies a top corner (i.e., upper rim or lip) 220 of ledge 110 (as shown in FIG. 2A) that coincides with sidewall S2.

Similarly, gate metal 115 also continuously overlies/covers sidewall S3 of source access region 106 along its width so as to completely cover the conducting layers of superlattice 204 that intersect the sidewall (see, particularly, gate metal A). Gate metal 115 may include a portion of gate metal that spills over onto and thus overlies a top corner (i.e., upper rim or lip) of sidewall S3 (as shown in FIG. 2A), similar to the way the gate metal spills over ledge 110.

Figure 3:
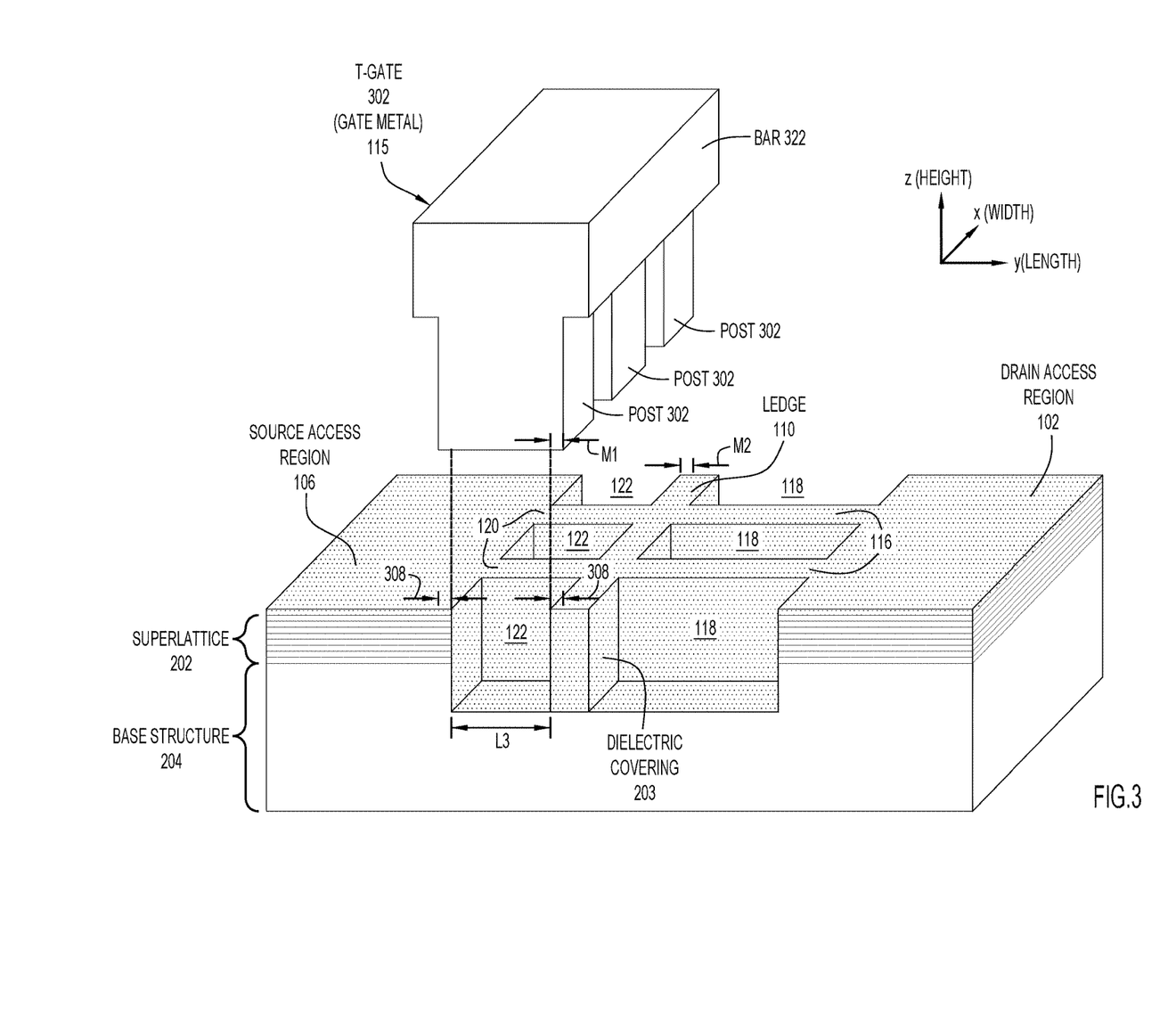
FIG. 3 is a perspective of view of the example SLCFET device structure in which gate metal is configured as a T-gate, according to an embodiment.

FIG. 3 is a perspective of view of SLCFET device structure 100 in which gate metal 115 is configured as a T-gate 302, rather than as a generally conformal layer A and/or B as shown in FIGS. 2A and 2B. T-gate 302 overlies ridges 120 and trenches 122 of channel region 114, and overlies top corner portions 306 and 308 of ledge 110 and source access region 106, respectively. While T-gate 302 is generally in contact with underlying components/elements of device structure 100 in the manner described below, in FIG. 3, the T-gate is shown vertically separated from the those elements/components for purposes of viewing clarity, only. T-gate 302 includes multiple vertically extending posts 320 spaced-apart one from the next in the width direction and having respective tops each connected to bottom portion of an elongate bar 322 extending in the width direction. Posts 320 are shaped, sized, and spaced to be received in and completely fill respective ones of trenches 122, while straddling ridges 120. Thus, posts 320 contact respective trench bottoms 214, and respective sidewalls 210 and topsides 212 of ridges 120.

FIG. 3 also shows margins M1 and M2 for electron beam ("e-beam") alignment tolerances.

An example fabrication of SLCFET device structure 100 is now described in connection with FIGS. 5-9.

Figure 5:
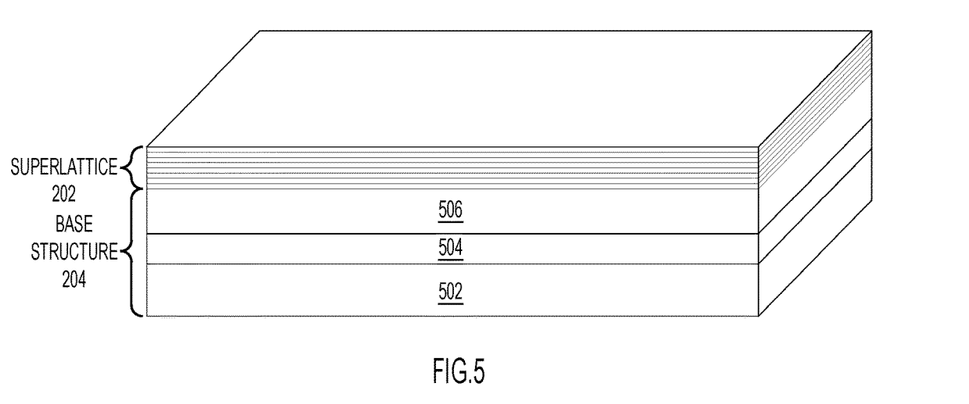
FIG. 5 is an illustration of an example epitaxial structure formed in initial stages of fabricating the example SLCFET device structure.

FIG. 5 is an illustration of an epitaxial structure formed in initial stages of the fabrication. The epitaxial structure includes superlattice 202 and base structure 204. Base structure 204 may comprise a base layer 502, a nucleation layer 504 overlying the base layer, and a buffer layer 506, overlying the nucleation layer, of, for example, Silicon Carbide (SiC), AlN, and AlGaN, respectively. Optionally, base layer 502 may comprise sapphire, nucleation layer 504 may comprise a combination of a low-temperature GaN layer and a high-temperature GaN layer, and buffer layer 506 may be based on the material of the superlattice to be located thereon, if required. Alternatively, base layer 502 may comprise (111)-orientated crystalline silicon, nucleation layer 504 may comprise AlN and buffer layer 506 may comprise a series of discrete AlGaN layers (typically between two and eight layers). Other base structures will be apparent to those skilled in the art.

The epitaxial structure also includes heterostructure layers of superlattice 204 formed (e.g., deposited) on base structure 204 using successive applications of an epitaxial growth process. The growth process may include Metal Organic Chemical Vapor Deposition (MOCVD) or Molecular Beam Epitaxy (MBE), for example.

Figure 6:
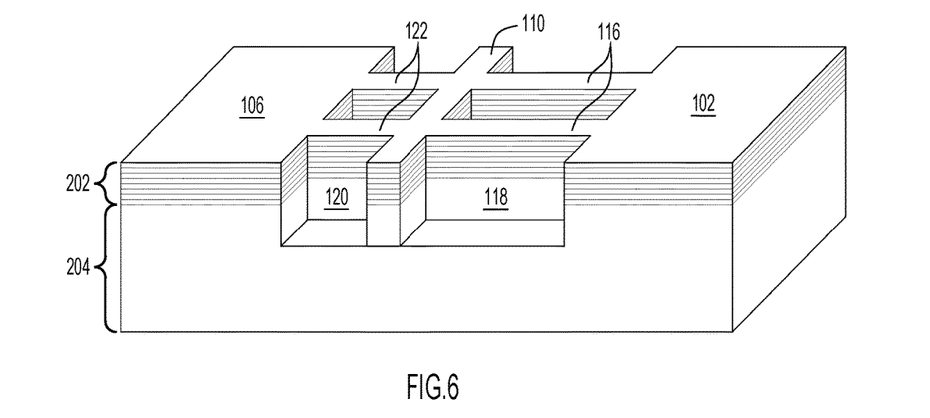
FIG. 6 is an illustration of the example epitaxial structure of FIG. 5 after multichannel ridges, trenches, and a ledge have been formed in the epitaxial structure.

FIG. 6 is an illustration of the epitaxial structure of FIG. 5 after drain-side ridges 116 and trenches 118, source-side (i.e., channel region) ridges 120 and trenches 122, and ledge 110 have been formed in the epitaxial structure. The aforementioned structures may be etched into the superlattice using Reactive Ion Etching (ME), for example.

Figure 7:
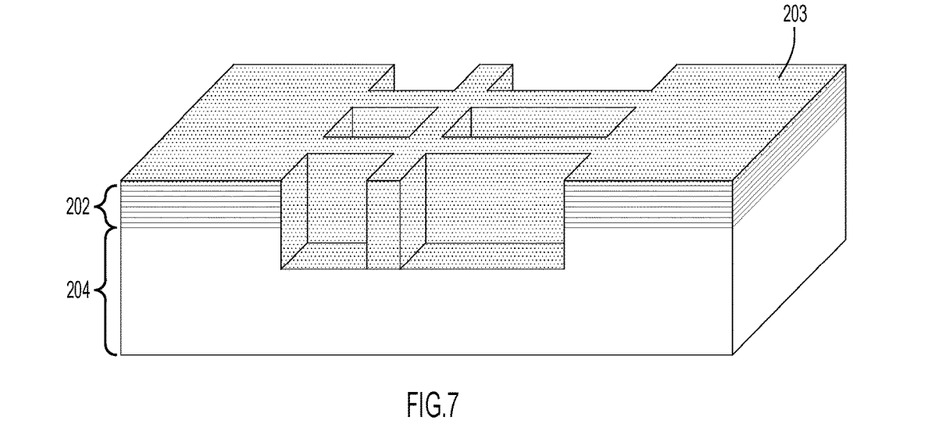
FIG. 7 is an illustration of the example epitaxial structure of FIG. 6 after a conformal gate dielectric has been formed on the epitaxial structure.

FIG. 7 is an illustration of the epitaxial structure of FIG. 6 after conformal gate dielectric 203 has been formed on a top surface of the epitaxial structure. The gate dielectric may be deposited using low-pressure chemical vapor deposition (LPCVD), plasma-enhanced chemical vapor deposition (PECVD). Alternatively, the gate dielectric may be omitted.

Figure 8:
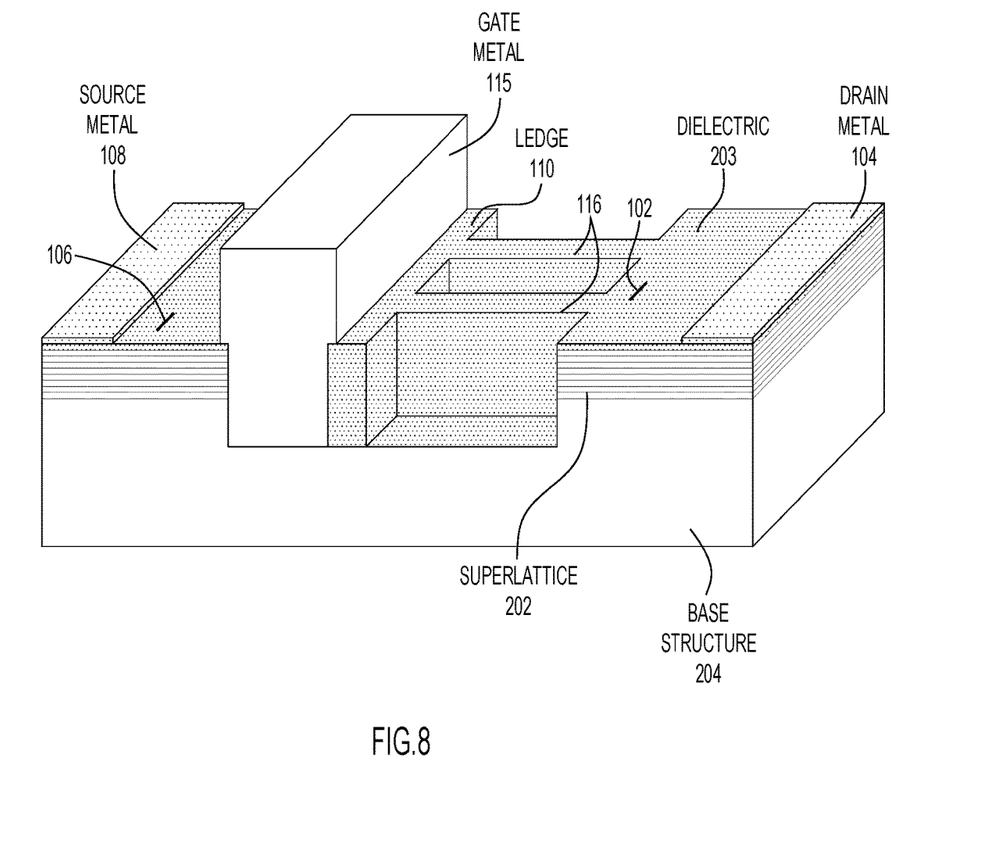
FIG. 8 is an illustration of the example epitaxial structure of FIG. 7 after gate metal has been formed on the epitaxial structure.

FIG. 8 is an illustration of the epitaxial structure of FIG. 7 after gate metal 115 has been formed on the epitaxial structure. Gate metal 115 may be formed using electron beam lithography, metal deposition by reactive direct current (DC) or radio frequency (RF) sputtering, thermal evaporation, and liftoff. In the example shown in FIG. 8, gate metal 115 forms posts 302 that fill trenches 122, and includes bar 322 connecting the posts and extending across ridges 122, as shown in FIG. 3. Similar techniques may be used to form source and drain metal 802 and 804 on the epitaxial structure.

Figure 9:
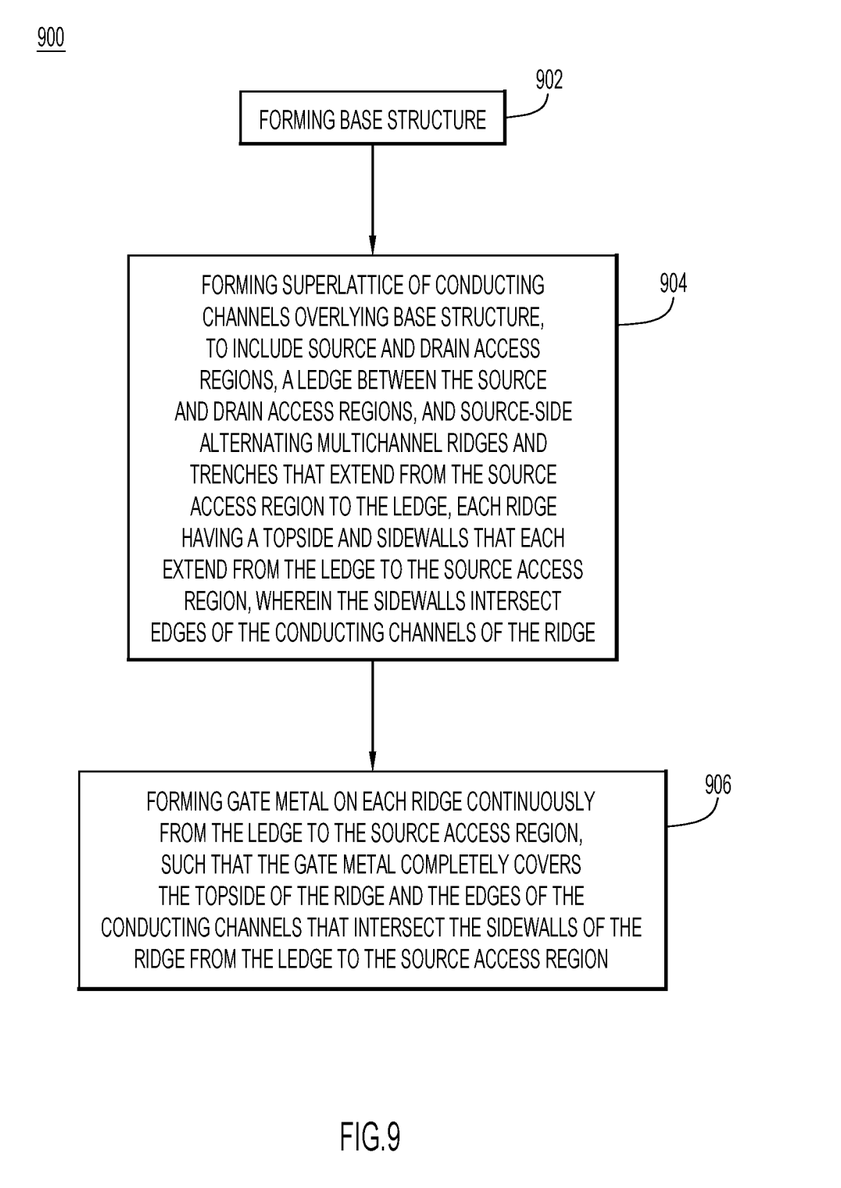
FIG. 9 is a flowchart of an example method of making the SLCFET device structure.

FIG. 9 is a flowchart of an example method 900 of making SLCFET device structure 100.

Operation 902 includes forming a base structure.

Operation 904 includes forming a superlattice of conducting channels overlying the base structure, and forming the following structures in the superlattice:
  a. source and drain access regions spaced-apart from each other;
  b. a ledge between and spaced-apart from the source and drain access regions; and
  c. source-side alternating multichannel ridges and trenches that extend from the source access region to the ledge, each ridge having a topside and opposing sidewalls that each extend from the ledge to the source access region, wherein the sidewalls intersect edges of the conducting channels of the ridge. Operation 904 optionally includes forming in the superlattice drain-side alternating multichannel ridges and trenches that extend from the wall to the drain access region.

Operation 906 includes forming gate metal on each ridge continuously from the ledge to the source access region, such that the gate metal completely covers the topside of the ridge and the edges of the conducting channels that intersect the sidewalls of the ridge from the ledge to the source access region.

In summary, embodiments presented herein are directed to introducing a ledge (also referred to as a boundary "wall") into the castellation patterning of a SLCFET device separating the channel region castellations from the (drain) access region castellations. The drain ledge provides a buffer against misalignment between the gate and channel regions. The subsequent gate pattern is oversized so that the channel castellations are completely covered by gate metal even under worst case gate-to-castellation misalignment. Castellations in the access region are then optimized independently of the drain castellations. In one embodiment, the source-side castellations may be eliminated completely, while the drain-side castellations are tapered to provide high breakdown voltage with low series resistance. The drain ledge enables the elimination of source-side castellations through the use of a self-aligned gate, while at the same time retaining the benefits of drain-side castellations. Moreover, channel castellations and drain castellations are able to be optimized separately.

In one aspect, a transistor device is provided comprising: a base structure; a superlattice of conducting channels overlying the base structure and including: source and drain access regions spaced-apart from each other; a ledge between and spaced-apart from the source and drain access regions; and source-side alternating multichannel ridges and trenches that extend from the source access region to the ledge, each ridge having a topside and opposing sidewalls that each extend from the ledge to the source access region; and gate metal that covers each ridge continuously from the ledge to the source access region, such that the gate metal completely covers the topside of the ridge and edges of the conducting channels that intersect the sidewalls of the ridge.

In another aspect, a method of making a transistor device is provided comprising forming a base structure; forming a superlattice of conducting channels overlying the base structure and including: source and drain access regions spaced-apart from each other; a ledge between and spaced-apart from the source and drain access regions; and source-side alternating multichannel ridges and trenches that extend from the source access region to the ledge, each ridge having a topside and opposing sidewalls that each extend from the ledge to the source access region, wherein the sidewalls intersect edges of the conducting channels of the ridge; and forming gate metal on each ridge continuously from the ledge to the source access region, such that the gate metal completely covers the topside of the ridge and the edges of the conducting channels that intersect the sidewalls of the ridge from the ledge to the source access region.

The above description is intended by way of example only. The description is not intended to be exhaustive nor is the invention intended to be limited to the disclosed example embodiment(s). Many modifications and variations will be apparent to those of ordinary skill in the art without departing from the scope and spirit of the invention.

What is claimed is:

1. A transistor device, comprising:
  a base structure;
  a superlattice of conducting channels overlying the base structure and including:
    source and drain access regions spaced-apart from each other;
    a ledge, formed in the superlattice of conducting channels, between and spaced-apart from the source and drain access regions; and
    source-side alternating multichannel ridges and trenches that extend from the source access region to the ledge, each ridge having a topside and opposing sidewalls that each extend from the ledge to the source access region, wherein the ledge is transverse to the source-side alternating multichannel ridges and trenches; and
  gate metal that covers each ridge continuously from the ledge to the source access region, such that the gate metal completely covers the topside of the ridge and edges of the conducting channels that intersect the sidewalls of the ridge.

2. The transistor device of claim 1, wherein:
  the source and drain access regions are spaced-apart from each other along a length direction;
  the alternating ridges and trenches extend along the length direction and undulate along a width direction that is transverse to the length direction; and
  the ledge extends continuously along the width direction.

3. The transistor device of claim 1, wherein:
  the ledge includes a sidewall forming a boundary between the ledge and the source-side alternating multichannel ridges and trenches and configured to constrain the gate metal to the source-side alternating multichannel ridges and trenches; and
  the gate metal covers the sidewall of the ledge, such that the gate metal completely covers edges of the conducting channels that intersect the sidewall of the ledge.

4. The transistor device of claim 1, wherein the superlattice of conducting channels further includes drain-side alternating multichannel ridges and trenches that extend from the ledge to the drain access region.

5. The transistor device of claim 1, wherein the gate metal includes a conformal metal layer that covers the topside and the sidewalls of each multichannel ridge.

6. The transistor device of claim 5, wherein the conformal metal layer continuously covers the topside and the sidewalls of each multichannel ridge, and each trench, completely, from the ledge to the source access region.

7. The transistor device of claim 1, wherein the gate metal includes metal configured as a T-gate that completely fills each trench and covers the topside and sidewalls of each multichannel ridge.

8. The transistor device of claim 1, wherein the source and drain access region each have a substantially planar configuration without alternating multichannel ridges and trenches.

9. The transistor device of claim 1, wherein a spacing between the ledge and the source access region defines a length of the gate.

10. The transistor device of claim 1, wherein the opposing sidewalls of each multichannel ridge are tapered toward each other such that a separation between the sidewalls decreases as the sidewalls rise from the base structure to the topside of the multichannel ridge.

11. The transistor device of claim 1, wherein the gate metal completely fills each trench from a nadir of the trenches to a full height of the multichannel ridges above the base structure.

12. The transistor device of claim 1, wherein the conducting channels include two-dimensional electron gas (2DEG) channels.

13. The transistor device of claim 1, wherein the superlattice comprises heterostructures that form the conducting channels.

14. The transistor device of claim 13, wherein each heterostructure includes an AlGaN layer and a GaN layer.

15. The transistor device of claim 1, wherein the transistor device is configured as a field effect transistor (FET).

16. A method of forming a transistor device, comprising:
forming a base structure;
forming a superlattice of conducting channels overlying the base structure and including:
source and drain access regions spaced-apart from each other;
a ledge, formed in the superlattice of conducting channels, between and spaced-apart from the source and drain access regions; and
source-side alternating multichannel ridges and trenches that extend from the source access region to the ledge, each ridge having a topside and opposing sidewalls that each extend from the ledge to the source access region, wherein the sidewalls intersect edges of the conducting channels of the ridge, wherein the ledge is transverse to the source-side alternating multichannel ridges and trenches; and
forming gate metal on each ridge continuously from the ledge to the source access region, such that the gate metal completely covers the topside of the ridge and the edges of the conducting channels that intersect the sidewalls of the ridge from the ledge to the source access region.

17. The method of claim 16, wherein:
the source and drain access regions are spaced-apart from each other along a length direction;
the alternating ridges and trenches extend along the length direction and undulate along a width direction that is transverse to the length direction; and
the ledge extends continuously along the width direction.

18. The method of claim 16, further comprising:
forming in the superlattice of conducting channels drain-side alternating multichannel ridges and trenches that extend from the ledge to the drain access region.

19. The method of claim 16, wherein the step of forming gate metal includes forming the gate metal as a conformal metal layer that covers the topside and the sidewalls of each multichannel ridge.

20. The method of claim 19, wherein the step of forming the gate metal includes forming the gate metal as a conformal metal layer that continuously covers the topside and the sidewalls of each multichannel ridge, and each trench, completely, from the ledge to the source access region.

* * * * *